United States Patent [19]
Lee et al.

[11] Patent Number: 4,716,340
[45] Date of Patent: Dec. 29, 1987

[54] PRE-IONIZATION AIDED SPUTTER GUN

[75] Inventors: Kon J. Lee, Atlanta, Ga.; Anthony Musset, Haddon Heights, N.J.

[73] Assignee: Denton Vacuum Inc, Cherry Hill, N.J.

[21] Appl. No.: 807,345

[22] Filed: Dec. 10, 1985

[51] Int. Cl.$^4$ ............................ H01J 7/24; H05H 1/00
[52] U.S. Cl. ............................ 315/111.41; 315/39; 315/111.21; 315/111.31; 315/111.81; 313/360.1; 313/567; 313/577; 204/298
[58] Field of Search ............ 315/111.21, 111.31, 315/111.41, 111.81, 39; 313/567, 577, 360.1; 204/298

[56] References Cited

U.S. PATENT DOCUMENTS

| | | | |
|---|---|---|---|
| 3,678,334 | 7/1972 | Dugdale et al. | 315/111.81 |
| 3,760,225 | 9/1973 | Ehlers et al. | 315/111.31 |
| 3,955,118 | 5/1976 | Flemming | 315/111.81 |
| 4,301,391 | 11/1981 | Seliger et al. | 315/111.21 |
| 4,570,106 | 2/1986 | Sohval | 315/111.31 |
| 4,588,490 | 5/1986 | Cuomo et al. | 204/298 |
| 4,652,795 | 3/1987 | Lee et al. | 315/111.31 |

*Primary Examiner*—David K. Moore
*Assistant Examiner*—Michael J. Nickerson
*Attorney, Agent, or Firm*—William E. Cleaver

[57] ABSTRACT

In the present device the lower section is an external plasma gun which acts as a source of ionized gas. The upper section of the device is a magnetron which has a plasma chamber and which includes both a source of magnetic flux as well as the apparatus necessary to generate an electrostatic field so that within the plasma chamber of the magnetron there are EXB forces. The magnetron is supported in close proximity to, and is electrically insulated from, the external plasma gun. The above arrangement permits the magnetron to produce and maintain a plasma phenomenon with a very low pressure of gas (of the order of one millitorr to two tenths of a millitorr) in the vacuum chamber. Because of the reduced pressure in the vacuum chamber: the mean free path is longer than in the prior art and thus the throw distance to the substrate from the target can be much higher than in the prior art; there is reduced contamination in the vacuum chamber and in particular at the target and the substrate; there is better adhesion of the sputter particles to the substrate; and there is less gas and vapor occlusion inthe sputter film which in turn leads to a denser film.

8 Claims, 1 Drawing Figure

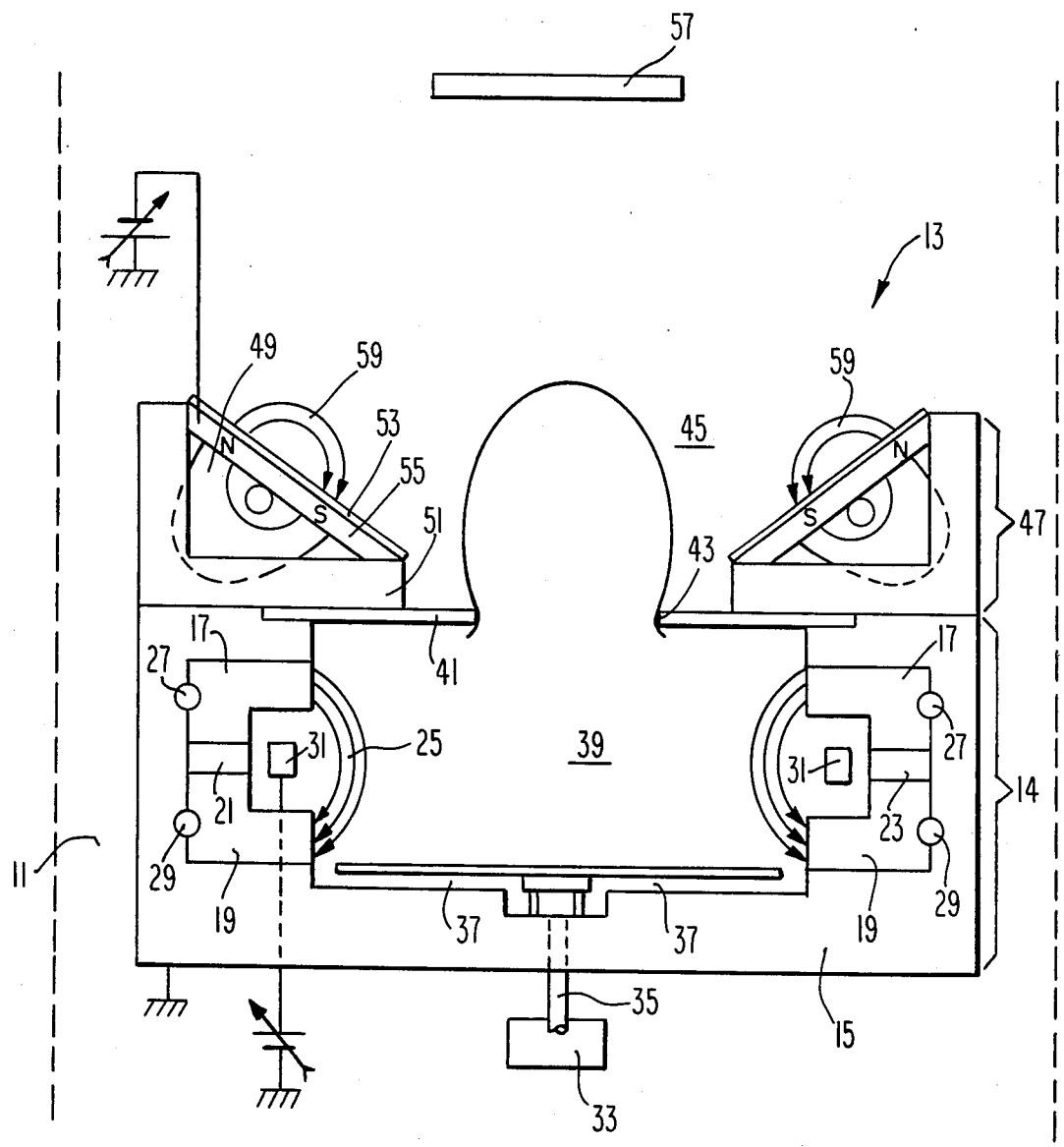

PRE-IONIZATION AIDED SPUTTER GUN

BACKGROUND OF THE INVENTION

The purpose of a sputter gun is to dislodge particles of material, such as metal, from a target and direct those particles to a substrate whereat they adhere to form a film on the substrate. Such sputtering takes place in a vacuum chamber. In the prior art, ionizable gas has been added to the vacuum chamber and a magnetron, which provides EXB forces, causes the gas to ionize and become a dense and localized plasma. The term ionizable gas means gas which is intended to ionized and throughout this description the term "gas" includes vapors as well. Within the plasma, mentioned above, there are electrons, ions and electronic neutrals. The ions, which are positively charged, are attracted to a cathode device which is the target. Those ions bombard the target, dislodge particles of cathode material and a large number of such particles, which are dislodged, leave the target and travel to the substrate. In some prior art arrangements, the substrates are located so as to be in the path position of the particle excursions. In the prior art the ionizable gas in the vacuum chamber, prior to ionization, is at least greater than two millitorr and generally of the order of ten millitorr. These relatively high gas pressures have been necessary heretofore to secure sufficient ionizing collisions to sustain the magnetron discharge. However such relatively high pressure gases cause problems for the sputtering technique. For instance, the gas molecules in the vacuum chamber moving about between the substrate and the target deflect the dislodged particles away from the substrate and this gives rise to low deposition efficiency. In addition, in the prior art, the large number of gas molecules present in the vacuum chamber results in many of them becoming occluded in the growing film. The contamination of the sputtered film by gas molecules produces a film which is less pure and which is porous. The density of the gas between the target and the substrate represents an impediment to the particles leaving the target. Accordingly the substrate must be located close to the target, in the prior art, so that a dislodged particle does not dissipate its energy colliding with gas molecules while traveling toward the substrate, thus impairing adhesion. The present device, because it provides pre-ionized gas to the magnetron chamber, enables the generation of plasma by the magnetron at a considerably lower gas pressure than is possible without pre-ionization.

SUMMARY OF THE INVENTION

The present apparatus consists of two chamber means. The lower chamber, as shown in the FIGURE, is an external plasma gun of the type described and claimed in the U.S. Pat. No. 4,652,795, "External Plasma Gun", issued on Mar. 24, 1987 and assigned to the assignee of this application. The external plasma gun injects a dense plasma into the plasma chamber of a magnetron which magnetron is mounted close to, but is electrically insulated from, said external plasma gun. The present apparatus is located within a vacuum chamber and ionizable gas is admitted into the external plasma gun, from which it emerges, partially ionized into the plasma chamber of the magnetron. It should be understood that the pressure of the ionizable gas in the external plasma gun is sufficiently high to enable the external plasma gun to create and maintain a plasma. However, when the partially ionizable gas exits from the gun, through the exit aperture, into the magnetron, its pressure drops greatly, (because of the limited conductance of the exit aperture), to be about one millitorr or less. Accordingly the gas pressure in the plasma chamber of the magnetron is about one millitorr or less. This partially ionized gas is subjected to the EXB forces provided by the magnetron and a second stage plasma is generated.

As is well understood, the magnetron operates to prolong the movement of electrons within the plasma, thereby providing a dense concentration of ions. The ions, in turn, bombard the target, which is part of the magnetron, to dislodge particles from the target. The particles leave the target with kinetic energy and travel to the substrate. The kinetic energy is not diminished, or spent, in the present device, to any large extent because the pressure in the vacuum chamber is relatively low compared to the pressure required by prior art devices. Accordingly the sputtered layer: has less porosity than the prior art devices; has better adhesion qualities than produced by the prior art devices; and is subject to less gas contamination than layers produced by the prior art devices. In addition, the distance between the substrate and the target, (i.e., the throw distance) can be substantially increased.

The objects and features of the present invention will be better understood in view of the following description studied in conjunction with the drawing which depicts a side, cross-sectional view of the present pre-ionization aided sputter gun.

DESCRIPTION OF THE PREFERRED EMBODIMENT

In the FIGURE, there is shown a dash-line which represents a vacuum chamber 11. Within the vacuum chamber 11 there is located the present pre-ionization aided sputter gun 13. In a preferred embodiment, the lower section of the sputter gun 13 is the external plasma gun, which as mentioned earlier is the subject of U.S. Pat. No. 4,652,795. The lower section of the sputter gun 13 includes the housing 15. The housing 15 is fabricated from aluminum or some other suitable non-magnetic electrically conducting material. Within the housing 15, there are located two ring-shaped magnetizable members 17 and 19. While the members 17 and 19 are ring-shaped in the preferred embodiment, they could be simply endless-shaped members, such as oblong shaped devices. The two magnetizable members 17 and 19, in a preferred embodiment are fabricated from easily magnetized material, such as soft iron. The two magnetizable rings 17 and 19 are separated by a plurality of insert magnets of which magnets 21 and 23 are examples. The magnets 21 and 23 (as well as the others not shown) have their north and south poles oriented to provide for flux generated as shown by flux 25. It should be understood that the insert magnets could have the polarities oriented in the opposite direction. It should also be understood that the flux is considered to be substantially parallel with the axis of the toroidal-shaped housing 15.

As can be further gleaned from the FIGURE, wound around the magnetizable members 17 and 19 are two coolant conducting pipes 27 and 29. The coolant conducting pipes 27 and 29 are connected to a suitable coolant source, so that the coolant can be pumped therethrough to maintain the external plasma gun in a cooled state.

It will be noted in the FIGURE that the inside surface of the magnetic flux generating means, i.e., the combination of the two magnetizable members 17 and 19 substantially resembles the letter "C", or is shaped concave. Within the concave configuration there is located an anode element 31. The anode 31 is ring-shaped, is suitably mounted, and is electrically isolated from the magnetic flux generating means. It becomes apparent from the drawing that when the magnetic flux generating means is generating flux, the flux takes the shape of the flux 25 and acts to shield the anode 31. Electrons in a plasma are impeded by the flux 25 from striking the anode 31, hence the anode is shielded. The housing 15 is shown connected to ground, while the anode 31 is shown connected to a variable d.c. voltage which is higher than ground. Hence member 31 is an anode compared to the housing 15 and therefore is an anode with respect to the members 17 and 19. It should be understood that the housing 15 could be connected to a variable voltage source as well.

With the housing 15 and the anode 31 being connected as shown in the FIGURE, the stage is set for the introduction of an ionizable gas such as argon or nitrogen or the like. When the sputtering operation is to take place, the vacuum chamber 11 is generally pumped down, typically to $1 \times 10^{-5}$ torr or lower. Thereafter ionizable gas such as argon, nitrogen or the like, is admitted into the chamber 39 of the external plasma gun 14. The ionizable gas is supplied from a source of gas 33, through the tubing 35, through the channel 37 into the chamber 39. We have found that if the gas is delivered uniformally around the edge of the shielded enclosure and then passed into the plasma chamber 39, the efficiency of production and the density, of the plasma is improved.

With the electrostatic field already being present, when the ionizable gas is passed into the chamber 39, a plasma is generated. The magnetic shielding of the anode causes the electrons to orbit and the plasma is then confined and dense. In the external plasma gun 14 there is an exit aperture plate 41 with an aperture 43 therein. When the plasma is generated in the chamber 39, the plasma exits through aperture 43 into the plasma chamber 45 of the magnetron 47. The limited conductance of the aperture 43 makes possible the pressure differential between the higher pressure in the chamber 39 and the lower pressure in the chamber 45. Accordingly the pressure in the magnetron plasma chamber 45 and in the vacuum chamber, as well, is a relatively low pressure in the order of 0.2 millitorr to 0.8 millitorr. The magnetron 47 is comprised of a circular horseshoe type magnet 49, which has its north and south poles as shown in the FIGURE. It should be understood that the opposite polarities could be used. The magnet 49 is held by the magnetron holder 51. The magnetron holder, in a preferred embodiment, is L-shaped as shown in the FIGURE and holds not only the magnet 49, but the target 53 and the target support 55. The target 53 is made of the material (for instance metal) which is going to be deposited on the substrate 57. The target support 55 is made of copper or some other non-magnet material which has good thermal conductivity. The target 53 is electrically conductive and, as shown in the FIGURE, is connected to a variable d.c. voltage source and is held negative with respect to the voltage applied to the housing 15. From the FIGURE it can be determined that the housing 15 is the cathode for the anode 31, while the target 53 is the cathode for the anode 41 (exit plate 41) or the housing 15. In the magnetron 47, the electrostatic field is from the exit plate 41 to the target 53. The holder 51 is fabricated from electrical insulating material such as alumina, in a preferred embodiment, but other suitable electrical insulating material could be used. It should be further understood that the target holder need not be mounted or held in abutment with the external plasma gun. The only requirements being that the target be held in close proximity so that an electrostatic field can be developed between the target and the top of the external plasma gun and so that the target be electrically insulated from the external plasma gun.

The magnetic field 59, as shown in the FIGURE, is generated by the magnet 49. It is well understood that the magnetron 47 provides EXB forces which are capable of generating a plasma.

The present apparatus is an improvement over the prior art in that the external plasma gun 14 injects a plasma into the magnetron 47. The foregoing arrangement enables the magnetron 47 to generate a plasma in plasma chamber 45 with very low pressure gases in the vacuum chamber 11. As explained above, because of the relatively low gas pressure (in the range of 0.2 millitorr to 0.8 millitorr) in the vacuum chamber, there is a reduction in the collision probability in the region between the substrate 57 and the target 53. Accordingly, the substrate can be moved further away from the target 53 (without the process suffering an excessive number of molecular collisions) because there is less gas molecule impediment to particles leaving the target 53 and traveling the substrate 57. The greater throw distance is an advantage in many processes. Further, as mentioned above, the reduction of gas pressure between the substrate 57 and target 53 reduces the number of gas molecules that intermingle with the sputtered particles which impinge on the substrate. The intermingling of the gas particles with the particles impinging on the substrate is a contamination of the sputtered film. Further as mentioned above, the reduced number of gas molecules between the target 53 and the substrate 57 mitigates the impediment to the travel of the particles. Hence the particles reach the substrate 57 with more kinetic energy and strike the substrate with greater impact. The foregoing provides better adhesion of the film, or the particles, to the substrate.

We claim:

1. A pre-ionization aided sputtering gun comprising in combination cold cathode plasma source means providing external plasma and having a substantially large aperture means therein, said substantially large aperture means disposed to enable plasma including partially ionized gas to pass from said cold cathode plasma source means; magnetron means having a plasma chamber formed therein and connected to electrical power means to provide EXB forces within said plasma chamber; and means mounting said magnetron means in close proximity to said cold cathode plasma source means and disposing said magnetron means such that plasma including partially ionized gas passing from said cold cathode plasma source means is passed into said plasma chamber of said magnetron means, and said means mounting said magnetron means effecting an electrical insulation between said cold cathode plasma source means and said magnetron means whereby when plasma including partially ionized gas is passed from said cold cathode plasma source into said plasma chamber of said magnetron means further ionization of said plasma takes place in said plasma chamber.

2. A pre-ionization aided sputtering gun according to claim 1 wherein said cold cathode plasma source means includes: a plasma chamber; a conduit means to enable ionizable gas to enter said plasma chamber; and a means to generate EXB forces whereby a dense plasma is generated in said cold cathode plasma source means.

3. A pre-ionization aided sputtering gun according to claim 1 wherein pressure of plasma passing through said aperture means is reduced to be in the range of 0.8 millitorr to 0.2 millitorr.

4. A pre-ionization aided sputtering gun according to claim 1 wherein said magnetron means includes a target means to which ions travel to bombard and dislodge particles therefrom.

5. A pre-ionization aided sputtering gun according to claim 4 wherein said target is mounted on a target support means which is fabricated from good thermal conducting material.

6. A pre-ionization aided sputtering gun according to claim 5 wherein said target means and said target support means are mounted on a holder means and wherein said holder means is fabricated from electrically insulating material.

7. A pre-ionization aided sputtering gun according to claim 6 wherein said holder means is disposed in abutment with said cold cathode plasma source means.

8. A pre-ionization aided sputtering gun according to claim 1 wherein said cold cathode source means has a housing means which is connected to a voltage source V and wherein said cold cathode plasma source includes an anode mounted therein which is connected to a voltage source whose value is positive with respect to V and wherein said magnetron means includes a target which is connected to a voltage source which is more negative than V.

* * * * *